United States Patent
Jang et al.

(10) Patent No.: US 7,927,515 B2
(45) Date of Patent: Apr. 19, 2011

(54) NANOCRYSTAL-METAL OXIDE-POLYMER COMPOSITES AND PREPARATION METHOD THEREOF

(75) Inventors: Hyo Sook Jang, Gyeonggi-do (KR); Eun Joo Jang, Gyeonggi-do (KR); Shin Ae Jun, Gyeonggi-do (KR); Jung Eun Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 12/260,197

(22) Filed: Oct. 29, 2008

(65) Prior Publication Data
US 2009/0294742 A1     Dec. 3, 2009

(30) Foreign Application Priority Data
May 30, 2008  (KR) .................. 10-2008-0050835

(51) Int. Cl.
*H01B 1/00* (2006.01)
*H01L 29/08* (2006.01)
*C09K 11/02* (2006.01)
*B05D 7/00* (2006.01)

(52) U.S. Cl. .............. 252/500; 252/301.4 R; 257/40; 427/212

(58) Field of Classification Search ........... 252/301.4 R, 252/500; 257/40; 427/212
See application file for complete search history.

(56) References Cited

U.S. PATENT DOCUMENTS

| | | | |
|---|---|---|---|
| 6,251,303 B1 * | 6/2001 | Bawendi et al. | 252/301.4 R |
| 6,548,168 B1 * | 4/2003 | Mulvaney et al. | 428/402 |
| 6,706,795 B1 * | 3/2004 | Garti et al. | 524/431 |
| 6,921,496 B2 * | 7/2005 | Anderson et al. | 252/301.6 S |
| 7,150,910 B2 * | 12/2006 | Eisler et al. | 428/325 |
| 7,190,870 B2 * | 3/2007 | Sundar et al. | 385/129 |
| 7,326,365 B2 * | 2/2008 | Bawendi et al. | 252/301.4 R |
| 2005/0107478 A1 * | 5/2005 | Klimov et al. | 516/98 |
| 2006/0167147 A1 * | 7/2006 | Asgari | 524/174 |
| 2007/0199109 A1 * | 8/2007 | Yi et al. | 977/811 |

FOREIGN PATENT DOCUMENTS
KR      1020040048093 A      7/2004
* cited by examiner

*Primary Examiner* — Mark Kopec
*Assistant Examiner* — Jaison P Thomas
(74) *Attorney, Agent, or Firm* — Cantor Colburn LLP

(57) ABSTRACT

Nanocrystal-metal oxide-polymer composites and their methods of preparation are described. The composites comprises a number of nanocrystals within a metal oxide matrix, and an oligomer or polymer covalently bonded to organic reactive groups of the metal oxide matrix. The composites can be applied to a variety of electronic devices. The electronic devices constructed from the composites do not decrease in performance rapidly due to degradation and exhibit improved stability.

5 Claims, 4 Drawing Sheets

NANOCRYSTAL-METAL OXIDE-POLYMER COMPOSITES AND PREPARATION METHOD THEREOF

This application claims priority to Korean Patent Application No. 2008-50835, filed on May 30, 2008, and all the benefits accruing therefrom under 35 U.S.C. §119, the contents of which in its entirety are herein incorporated by reference.

BACKGROUND

1. Field of the Invention

This disclosure is directed to nanocrystal-metal oxide-polymer composites and a method for preparing the composites. More specifically, each of the nanocrystal-metal oxide-polymer composites comprise a number of nanocrystals within a metal oxide matrix, and an oligomer or polymer covalently bonded to organic reactive groups of the metal oxide matrix to achieve improved stability.

2. Description of the Related Art

A nanocrystal is a crystalline material having a size of a few nanometers and consists of several hundred to several thousand atoms. Since a nanocrystal has a large surface area per unit volume, most of the constituent atoms of the nanocrystal are present at the surface of the nanocrystal and unexpected characteristics (e.g., quantum confinement effects) of the nanocrystal are exhibited. These structural characteristics account for unique electrical, magnetic, optical, chemical and mechanical properties of nanocrystals different from those inherent to the constituent materials of the nanocrystals.

The luminescent properties and electrical properties of nanocrystals can be controlled by manipulating various factors, such as size and composition, of the nanocrystals. Therefore, nanocrystals can find application in various industrial fields, including but not limited to light-emitting devices (e.g., light-emitting diodes ("LEDs"), electroluminescent ("EL") devices, laser devices, holographic devices and sensors) and electrical devices (e.g., solar cells and photodetectors).

A wet-chemical process is typically used to produce nanocrystals. According to this process, a precursor material is added to an organic solvent capable of being coordinated to the precursor material and is grown into nanocrystals having various sizes. The precursor, a dispersant and the solvent used for the production of the nanocrystals contain various kinds of organic materials, which remain on the surface of the nanocrystals. The introduction of functional groups into the organic materials enables the nanocrystals to be stably present in solvent systems having different polarities. This stability makes the nanocrystals suitable for use in a wider variety of technological applications, including but not limited to bio-applications. Further, an advantage of the nanocrystals in the form of composites is that high reliability can be ensured irrespective of ambient conditions.

However, a solid-state device employing nanocrystals may suffer from serious instability and decomposition due to the presence of organic materials. A surfactant and a solvent used for the production of the nanocrystals by wet synthesis and a dispersant, a precursor and another surfactant used for the preparation of nanocrystal composites may be freely exposed without being completely bound and fixed to the nanocrystals and a metal oxide to cause problems in terms of performance and stability of the device.

BRIEF SUMMARY OF THE INVENTION

Disclosed herein are nanocrystal-metal oxide-polymer composites, each of which has a number of nanocrystals within a metal oxide matrix, and an oligomer or polymer covalently bonded to the organic reactive groups of the metal oxide matrix.

The nanocrystal-metal oxide-polymer composites may have high luminescence efficiency and excellent stability.

Disclosed herein is a method for preparing nanocrystal-metal oxide-polymer composites, which comprises: reacting a surfactant with nanocrystals to modify the surfaces of the nanocrystals, the surfactant having at least one reactive group selected from —$SR_1$, —$NR_1R_2$, —$OR_1$, —$COOR_1$, —$PR_1R_2$, —P(═O)$R_1R_2$, —$SiR_1R_2R_3$ and —C(═O)$R_1$ (1) (wherein $R_1R_2$ and $R_3$, which may be the same or different, each represents H, $C_6$-$C_{24}$ alkyl, $C_6$-$C_{24}$ alkenyl, $C_6$-$C_{24}$ aryl or $C_6$-$C_{24}$ alkoxy); mixing the surface-modified nanocrystals, a dispersant, a metal oxide precursor, another surfactant, a solvent and water, and drying the mixture to obtain nanocrystal-metal oxide composites; preparing a monomer capable of covalently bonding to organic reactive groups of the nanocrystal-metal oxide composites; and polymerizing the nanocrystal-metal oxide composites and the monomer to prepare a polymer and form covalent bonds between the polymer and the organic reactive groups of a metal oxide matrix surrounding the nanocrystals.

Nanocrystal-metal oxide-polymer composites prepared by the method have high luminescence efficiency and are stable to light, air (oxygen), humidity (moisture) and chemicals.

Disclosed herein is an electronic device comprising the nanocrystal-metal oxide-polymer composites.

The performance of electronic devices does not deteriorate over time when nanocrystal-metal oxide-polymer composites of the invention are used. Therefore, the electronic devices can be stably operated for long periods of time.

BRIEF DESCRIPTION OF THE DRAWINGS

Exemplary embodiments will be more clearly understood from the following detailed description taken in conjunction with the accompanying drawings, in which.

DETAILED DESCRIPTION OF THE INVENTION

Figure 1:
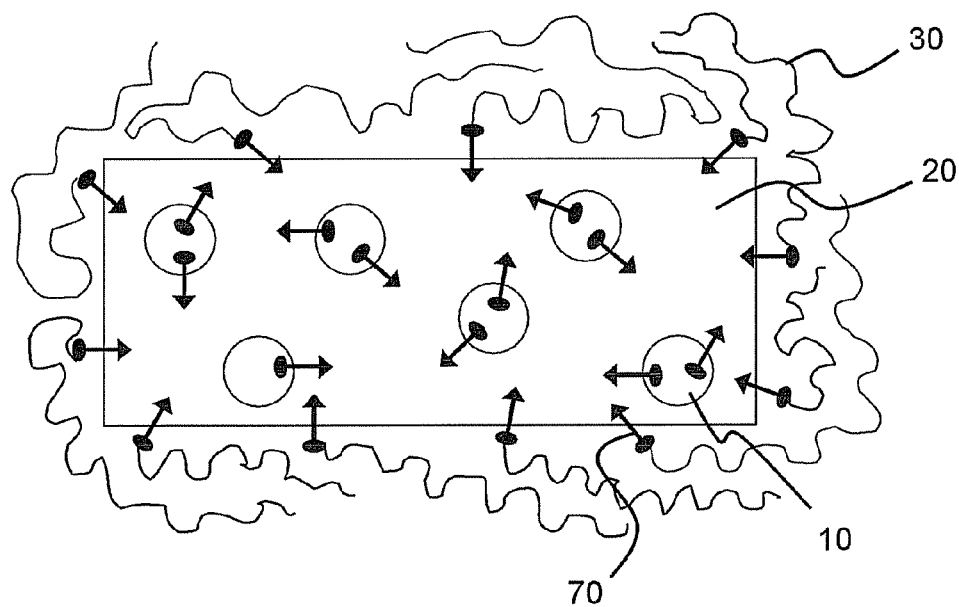
FIG. 1 is an exemplary schematic diagram illustrating the structure of a nanocrystal-metal oxide-polymer composite.

Hereinafter, a detailed description will be given of exemplary embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one exemplary embodiment nanocrystal-metal oxide-polymer composites are provided, each of which comprises a number of nanocrystals within a metal oxide matrix, and an oligomer or polymer covalently bonded to organic reactive groups of the metal oxide matrix. For example a nanocrystal-metal oxide-polymer composite may comprise nanocrystals, a metal oxide composite layer surrounding the nanocrystals and an organic polymer layer coated on the metal oxide composite layer.

In the nanocrystal-metal oxide-polymer composites, the covalent bonding between the free organic reactive groups of the metal oxide matrix and the polymer maintains the reactive groups in protected state. The nanocrystal-metal oxide composites repassivated with the polymer have the advantages of enhanced stability to air (oxygen), humidity (moisture), light and heat, thus leading to an increased lifetime. The nanocrystal-metal oxide composites repassivated with the polymer also have the advantages of being highly dispersible in a packaging resin, which uses an organic polymer to fabricate light-emitting and electrical devices.

FIG. 1 is an exemplary schematic diagram illustrating the structure of the nanocrystal-metal oxide-polymer composite. Referring to FIG. 1, the nanocrystal-metal oxide-polymer composite comprises a number of nanocrystals 10 within a metal oxide matrix 20 surrounding the nanocrystals, and an oligomer or polymer 30 covalently bonded to organic reactive groups 70 of the metal oxide matrix 20.

Figure 2:
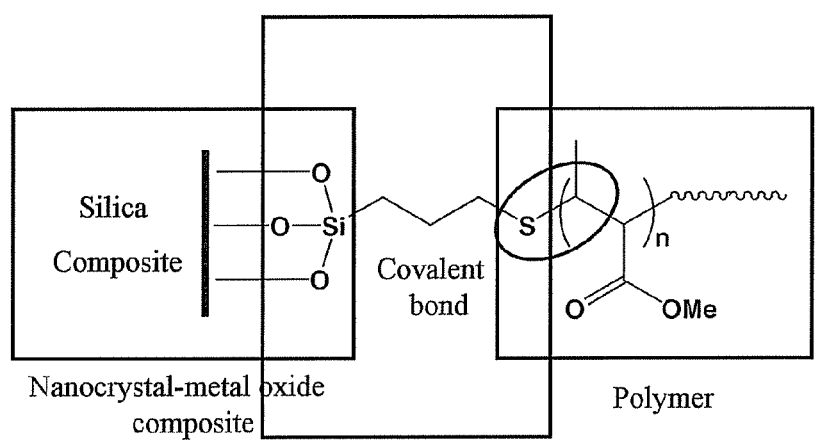
FIG. 2 is an exemplary schematic diagram illustrating a state of a nanocrystal-metal oxide-polymer composite in which a polymer is covalently bonded to a reactive group of a metal oxide.

In an exemplary embodiment the organic reactive groups 70 may be —$SR_1$, —$NR_1R_2$, —$OR_1$, —$COOR_1$, —$PR_1R_2$, —$P(=O)R_1R_2$, —$SiR_1R_2R_3$ and —$C(=O)R_1$ (wherein $R_1$, $R_2$ and $R_3$, which may be the same or different, each represents H, $C_6$-$C_{24}$ alkyl, $C_6$-$C_{24}$ alkenyl, $C_6$-$C_{24}$ aryl or $C_6$-$C_{24}$ alkoxy). The organic reactive groups 70 are those derived from a surfactant and a solvent used for the production of the nanocrystals by wet synthesis, the dispersant, the surfactants and the metal oxide precursor used for the preparation of the composites. As illustrated in FIG. 2, the organic reactive groups are covalently bonded to the polymer or the monomer before polymerization. This covalent bonding reduces or removes undesirable factors causing a reduction in the lifetime of the nanocrystal-metal oxide-polymer composites. Additionally, the covalent bonding between the organic reactive groups and the polymer can stably maintain the passivation state of the nanocrystal-metal oxide composites against external negative factors, such as heat, oxygen, moisture and light. Due to the repassivation of the polymer, the nanocrystal-metal oxide-polymer composites are more stable to external factors than the nanocrystal-metal oxide composites, thus leading to improvements in various characteristics, such as but not limited to increased lifetime and improved light stability.

The nanocrystals constituting the nanocrystal-metal oxide-polymer composites include, but are not limited to metal nanocrystals and semiconductor nanocrystals, which are produced by wet synthesis. For example, the semiconductor nanocrystals may be those of at least one compound selected from Group II-VI compounds, Group II-V compounds, Group III-VI compounds, Group III-V compounds, Group IV-VI compounds, Group I-III-VI compounds, Group II-IV-VI compounds, Group II-IV-V compounds and Group IV compounds; and alloys thereof.

Specifically, the nanocrystals may be those of at least one compound selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe and PbTe; and alloys thereof.

The nanocrystals may be present in the form of a mixture of two or more different materials. In the mixture, the materials may be mixed or partially divided crystal structures of the materials and may be present in the same particles. Alternatively, the materials may be present in the form of an alloy. The size of the nanocrystals is preferably in the range of about 2 nm to about 20 nm, but is not particularly limited to this range.

The nanocrystals may have a core, a core-shell, a core-multishell, a core-intermediate layer-shell, a core-alloy layer-shell structure, a core-intermediate layer-multishell, or a core-alloy layer-multishell structure. The nanocrystals may have a core-shell structure whose shell is composed of a large band gap material, such as but not limited to ZnS or ZnSe. Specifically, the core material of the core-shell structure can be selected from CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe and PbTe; and alloys and combinations thereof; and the shell material can be ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe; and alloys and combinations thereof.

The nanocrystals of the nanocrystal-metal oxide-polymer composites may have various shapes depending on the reaction conditions. Exemplary shapes of the nanocrystals are, but not limited to, spheres, tetrahedrons, cylinders, rods, triangles, discs, tripods, tetrapods, cubes, boxes, stars and tubes. The nanocrystals can efficiently emit light in the visible and other spectral regions (e.g., UV and infrared regions).

The metal oxide of the nanocrystal-metal oxide-polymer composites can be, but is not limited to, $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO, and $CrO_3$; and mixtures thereof. The metal oxide may be a two-component system, such as but not limited to $SiO_2$—$ZrO_2$, $SiO_2$—$TiO_2$ or $TiO_2$—$ZrO_2$, or a three-component system, such as but not limited to $V_2O_5$—$SiO_2$—$Nb_2O_5$.

In one exemplary embodiment there is provided a polymer covalently bonded to the molecules of the metal oxide matrix that has excellent thermal properties and a high refractive index. In another exemplary embodiment there is provided a colorless and transparent polymer that is used for the fabrication of light-emitting and light-receiving devices. Examples of colorless and transparent polymers include, but are not limited to, polyacrylate, polystyrene, polyamide, polyester, polyurea, polyacrylic acid, polycarbonate, polysiloxane, polyurethane, poly(ethylene oxide) and polyolefin.

In another exemplary embodiment there is provided a method for preparing nanocrystal-metal oxide-polymer composites.

According to the method, a surfactant is reacted with nanocrystals to modify the surfaces of the nanocrystals. The surfactant used herein has at least one reactive group selected from —$SR_1$, —$NR_1R_2$, —$OR_1$, —$COOR_1$, —$PR_1R_2$, —$P(=O) R_1R_2$, —$SiR_1R_2R_3$ and —$C(=O)R_1$ (1) (wherein $R_1$ $R_2$ and $R_3$, which may be the same or different, each represents H, $C_6$-$C_{24}$ alkyl, $C_6$-$C_{24}$ alkenyl, $C_6$-$C_{24}$ aryl or $C_6$-$C_{24}$ alkoxy).

Subsequently, the surface-modified nanocrystals, a metal oxide precursor, a dispersant, another surfactant, a solvent and water are mixed together and the mixture is dried to obtain nanocrystal-metal oxide composites. Then, a monomer capable of covalently bonding to reactive groups of the nanocrystal-metal oxide composites is prepared. The nanocrystal-metal oxide composites and the monomer are polymerized to prepare a polymer from the monomer and form covalent bonds between the polymer and the organic reactive groups of a metal oxide matrix.

Below, individual steps of the method are described in detail.

a) Surface Modification of the Nanocrystals

Optionally, at least one organic material may be coordinated to the surfaces of nanocrystals before surface modification. This surface coordination results in improved suspension stability of the nanocrystals and can prevent aggregation of the nanocrystals. The organic material layer may be formed by a surfactant and a solvent used for the growth of the nanocrystals. There is no particular restriction on the kind of the organic material. As the organic material, there may be exemplified a $C_6$-$C_{24}$ alkane or alkene having at least one terminal group selected from COOH, $PO_3H_2$, PO, SH and $NH_2$ groups. Specific examples of such organic materials include oleic acid, stearic acid, palmitic acid, hexylphosphonic acid, n-octylphosphonic acid, tetradecylphosphonic acid, octadecylphosphonic acid, trioctylphosphine oxide, n-octylamine, hexadecylamine and trioctylamine.

Examples of surfactants suitable for the surface modification of the nanocrystals include, but are not limited to, bicompatible and multicompatible surfactants. A bicompatible surfactant refers to a compound that can be coordinated to the surface of a nanocrystal at one side of the molecule and is bound to a metal oxide structure at the other side of the molecule. A multicompatible surfactant refers to a compound that can be simultaneously bound to the surface of a nanocrystal, a metal oxide structure and a polymer.

Any surfactant may be used herein so long as it has a functional group selected from —SH, —$NH_2$, —COOH, —$PO_3H_2$, —PO, —CN and —SCN capable of binding to the surfaces of the nanocrystals at one end thereof and a hydrophilic functional group selected from —OH, —COOH, —$NH_2$, —$PO_3H_2$, —$SO_3H$ and —CN at the other end thereof.

Suitable urfactants include but are not limited to cationic surfactants, such as but not limited to alkyl trimethylammonium halides (e.g., cetyltrimethylammonium bromide); neutral surfactants, such as oleic acid, trioctylphosphine oxide ("TOPO"), trioctylphosphine ("TOP"), tributylphosphine, oleic amine, alkylamines (e.g., trioctylamine and octylamine), and alkylthiols; and anionic surfactants, such as sodium alkyl sulfates and sodium alkyl phosphates. If needed, two or more surfactants may be used together or sequentially.

Most of the nanocrystals are surrounded by a hydrophobic surfactant after production, which can also be used without further purification.

The nanocrystals may be those of at least one compound selected from the group consisting of metals, Group II-VI compounds, Group II-V compounds, Group III-VI compounds, Group III-V compounds, Group IV-VI compounds, Group I-III-VI compounds, Group II-IV-VI compounds, Group II-IV-V compounds and Group IV compounds; and alloys thereof. Non-limiting examples of such nanocrystals may be nanocrystals of at least one compound selected from CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Pd, Si, Ge, PbS, PbSe and PbTe; and alloys thereof.

The Group II-VI compounds are selected from but not necessarily limited to: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from, but not limited to: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from but not limited to: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds are selected from, but not limited to: unary compounds, e.g., Si and Ge; and binary compounds, e.g., SiC and SiGe.

The nanocrystals may further include an overcoating to form a core-shell structure. The nanocrystals may have a multilayer structure composed of a core and at least one layer. The overcoating or the constituent layer of the multilayer may be formed of a material selected from Group II-VI compounds, Group III-V compounds, Group IV-VI compounds and Group IV compounds; and mixtures thereof.

The Group II-VI compounds can be selected from: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds can be selected from: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds can be selected from: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds can be selected from: unary compounds, e.g., Si and Ge; and binary compounds, e.g., SiC and SiGe.

The nanocrystals may have a core, a core-shell, a core-multishell, a core-intermediate layer-shell, a core-alloy layer-shell structure, a core-intermediate layer-multishell, or a core-alloy layer-multishell structure. The nanocrystals may have a core-shell structure in which the core material is selected from CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Pd, Si, Ge, PbS, PbSe and PbTe; and alloys and combinations thereof; and the shell material is selected from ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, Fe, Pt, Ni, Co, Al, Ag, Au, Cu, FePt, Pd, Si and Ge; and alloys and combinations thereof.

b) Formation of Nanocrystal-Metal Oxide Composites

The nanocrystals whose surfaces are modified by the surfactant or a solution thereof, a metal oxide precursor, a dispersant, another surfactant, a solvent and water are mixed together, and then the mixture is dried to induce crosslinking. As a result of the crosslinking, nanocrystal-metal oxide composites are obtained. The drying is preferably conducted at about 60° C. to about 150° C. to solidify and make the nanocrystal-metal oxide composites harder. The nanocrystal-metal oxide composites can be prepared in the form of a power, thin film or monolith. The concentration of the nanocrystals in the nanocrystal-metal oxide composites can be controlled by varying the amounts of the nanocrystals and the metal oxide precursor. For example, the concentration of the nanocrystals can be adjusted in the range of 0.01 to 20 vol %.

The metal oxide precursor may be, but is not limited to, a metal alkoxide, a metal halide, a metal hydroxide.

Examples of suitable metal alkoxides include but are not limited to titanium methoxide, titanium ethoxide, titanium isopropoxide, titanium butoxide, zinc methoxide, zinc ethoxide, zinc isopropoxide, zinc butoxide, tetramethylorthosilicate, tetraethylorthosilicate, silicon tetraisopropoxide, silicon tetrabutoxide, trimethoxysilane, triethoxysilane, mercaptopropyltrimethoxysilane, mercaptopropyltriethoxysilane, aminopropyltrimethoxysilane, aminopropyltriethoxysilane, tin methoxide, tin ethoxide, tin isopropoxide, tin butoxide, tungsten methoxide, tungsten ethoxide, tungsten isopropoxide, tungsten butoxide, tantalum methoxide, tantalum ethoxide, tantalum isopropoxide, tantalum butoxide, barium methoxide, barium ethoxide, barium isopropoxide, barium butoxide, zirconium methoxide, zirconium ethoxide, zirconium isopropoxide, zirconium butoxide, aluminum methoxide, aluminum ethoxide, aluminum isopropoxide, aluminum butoxide, yttrium methoxide, yttrium ethoxide, yttrium isopropoxide, yttrium butoxide, iron methoxide, iron ethoxide, iron isopropoxide, iron butoxide, cesium methoxide, cesium ethoxide, cesium isopropoxide, cesium butoxide, chromium methoxide, chromium ethoxide, chromium isopropoxide, and chromium butoxide; or mixtures thereof.

Examples of suitable metal halides include but are not limited to titanium chloride, zinc chloride, silicon tetrachloride, tin chloride, tungsten chloride, tantalum chloride, barium chloride, zirconium chloride, hafnium chloride, aluminum chloride, yttrium chloride, iron (II) chloride, iron (III) chloride, cesium chloride, chromium chloride, titanium bromide, zinc bromide, silicon tetrabromide, tin bromide, tungsten bromide, tantalum bromide, barium bromide, zirconium bromide, hafnium bromide, aluminum bromide, yttrium bromide, iron (II) bromide, iron (III) bromide, cesium bromide, chromium bromide, titanium iodide, zinc iodide, silicon tetraiodide, tin iodide, tungsten iodide, tantalum iodide, barium iodide, zirconium iodide, hafnium iodide, aluminum iodide, yttrium iodide, iron (II) iodide, iron (III) iodide, cesium iodide, chromium iodide; or mixtures thereof.

Examples of suitable metal hydroxides include but are not limited to titanium hydroxide, zinc hydroxide, silicon hydroxide, tin hydroxide, tungsten hydroxide, tantalum hydroxide, barium hydroxide, zirconium hydroxide, hafnium hydroxide, aluminum hydroxide, yttrium hydroxide, iron (II) hydroxide, iron (III) hydroxide, cesium hydroxide, chromium hydroxide; or mixtures thereof.

Examples of suitable dispersants and surfactants, include but are not limited to mercaptopropyltrimethoxysilane, mercaptopropyltriethoxysilane, mercaptohexanol, mercaptopropyl alcohol, aminopentanol, bistriethoxysilylethane, bistriethoxysilyloctane, tris(diethoxysilacyclohexane), aminopropyltrimethoxysilane, methyltrimethoxysilane and propyltrimethoxysilane.

Examples of suitable solvents include but are not limited to $C_6$-$C_{24}$ primary, secondary and tertiary alkylamines, $C_6$-$C_{24}$ primary, secondary and tertiary alcohols, $C_6$-$C_{24}$ ketones and esters, $C_6$-$C_{24}$ heterocyclic compounds containing nitrogen or sulfur, $C_6$-$C_{24}$ alkanes, $C_6$-$C_{24}$ alkenes, $C_6$-$C_{24}$ alkynes, trioctylamine, trioctylphosphine and trioctylphosphine oxide.

c) Preparation of Monomer

A monomer capable of covalently bonding to the organic reactive groups of the nanocrystal-metal oxide composites is prepared. A polymer that can be prepared from the monomer to form covalent bonds with the molecules of the nanocrystal-metal oxide matrix is, for example one that has excellent thermal properties and a high refractive index. For example, a colorless and transparent polymer may be used when it is intended to fabricate light-emitting and light-receiving devices. Examples of such polymers include, but are not limited to, polyacrylate, polystyrene, polyamide, polyester, polyurea, polyacrylic acid, polycarbonate, polysiloxane, polyurethane, poly(ethylene oxide) and polyolefin.

Examples of monomers suitable for use in exemplary embodiments include, but are not limited to, radical polymerizable monomers, such as, but not limited to alkyl methacrylates, styrene, acrylic acid, esters, olefins, alkyl alcohols, alkyl carboxylic acids, alkylamines, amino acids and isocyanates; and mixtures thereof.

d) Formation of Nanocrystal-Metal Oxide-Polymer Composites

The nanocrystal-metal oxide composites and the monomer are polymerized to prepare an oligomer or polymer from the monomer and form covalent bonds between the oligomer or polymer and the organic reactive groups of the metal oxide matrix. The nanocrystal-metal oxide matrix and the monomer are polymerized in a solvent in the presence of an initiator to form covalent bonds between the organic reactive groups present around the nanocrystals or within a metal oxide matrix and the reactive groups of a polymer prepared from the monomer. During polymerization of the radical polymerizable monomer by the initiator, the organic reactive groups of the nanocrystal-metal oxide composites in place of the monomer may be connected to a growing oligomer or polymer chain. For example, the organic reactive groups of the nanocrystal-metal oxide composites act as chain transfer agents. As a result, the organic reactive groups can be protected and the nanocrystal-metal oxide composites can be coated with the polymer. At this point in the process, the size of the oligomer or polymer covalently bonded to the molecules of the metal oxide matrix can be manipulated by varying the polymerization time, the concentrations of the monomer and the initiator, or the time when the initiator is added; or by a combination of varying the aforementioned parameters.

The polymerization method is not limited and can be selected depending on the intended application of the final composites and the characteristics of the polymer. The polymerization method that can be selected includes, but is not limited to, thermal radical polymerization using a polymerization initiator or photopolymerization.

Examples of radical polymerization initiatorused in the polymerization, include but are not limited to an azo compound, such as, but not limited to, azoisobutyronitrile ("AIBN"), azodicyclohexylcarbonitrile or dimethyl-α,α-azodiisobutyrate; or an organic peroxide initiator, such as, but not limited to, benzoyl peroxide, lauryl peroxide, t-butyl benzoate, acetyl peroxide, t-butyl hydroperoxide, cumene hydroperoxide, di-t-butyl peroxide, dicumyl peroxide or dichlorobenzoyl peroxide.

Examples of solvents suitable for the polymerization include, but are not limited to, toluene, hexane, arenes, alkanes, alkyl alcohols, acetone, ethyl acetate, dichloromethane, chloroform, dimethylformamide, tetrahydrofuran, dimethyl sulfoxide, pyridine, and alkyl amines; and mixtures thereof.

In another exemplary embodiment, there is provided an electronic device comprising the nanocrystal-metal oxide-polymer composites. The nanocrystal-metal oxide-polymer composites can find application in various energy fields, such as, but not limited to, displays (e.g., PDPs and LEDs) requiring light-emitting materials, electroluminescent devices using nanocrystals as materials for light-emitting layers, laser devices, linear optical devices, sensors, including but not limited to biosensors reacting with target materials to emit light, and photovoltaic devices.

The nanocrystal-metal oxide-polymer composites are suitable for use in the formation of a light-emitting layer of an electroluminescent device because of their pure spectrum in the visible region. The nanocrystal-metal oxide-polymer composites can be introduced into a light-emitting layer by vacuum evaporation, sputtering, printing, coating, ink jetting or e-beam evaporation.

The nanocrystal-metal oxide-polymer composites have the advantages of an ability to adjust various band gaps, high quantum efficiency and good color purity. Owing to these properties the composites can be used as light-emitting materials of a variety of electroluminescent devices that convert electrical energy to light energy.

A better understanding of exemplary embodiments will be described in more detail with reference to the following examples. However, these examples are given merely for the purpose of illustration and are not to be construed as limiting the scope of the embodiments.

EXAMPLES

Preparative Example 1

Synthesis of CdSe/CdS.ZnS 40 ml of trioctylamine ("TOA"), 1.8 g of oleic acid and 0.206 g of cadmium oxide were simultaneously put into a 250 ml flask equipped with a reflux condenser. The mixture was allowed to react with stirring while maintaining the reaction temperature at 300° C. Separately, a selenium (Se) powder was dissolved in trioctylphosphine ("TOP") to obtain a Se-TOP complex solution in which the selenium was present at a concentration of about 2 M. 0.2 ml of the Se-TOP complex solution and 2 ml of TOA were rapidly fed to the reaction mixture with stirring and the reaction was allowed to proceed for about 1.5 minutes to produce CdSe nanocrystals. To the reaction mixture was slowly added a mixture of 210 µl of octanethiol and 9 ml of TOA. The resulting mixture was allowed to react for 40 minutes. Separately, 20 ml of TOA, 1.808 g of oleic acid and 0.587 g of zinc acetate were put into a 125-mL flask equipped with a reflux condenser and the mixture was completely dissolved at high temperature. The TOA solution was slowly added to the reaction solution, and then a mixture of 1.1 ml of octanethiol and 6 ml of TOA was slowly added thereto. The resulting mixture was allowed to react for about one hour.

After the reaction was finished, the reaction mixture was cooled to room temperature as rapidly as possible. Ethanol as a non-solvent was added to the reaction mixture, followed by centrifugation. The supernatant was discarded, and the precipitate was collected and dispersed in toluene to prepare a dispersion of CdSe/CdS.ZnS nanocrystals (1 wt %). The nanocrystals had a diameter of 8 nm and emitted light at 615 nm.

Preparative Example 2

Preparation of QD-Silica Composites

Ethanol was added to the toluene solution of the CdSe/CdS.ZnS (1 wt %), followed by centrifugation. The obtained precipitate was collected and dissolved in 50 µl of mercaptopropyltriethoxysilane and 50 µl of mercaptohexanol. 200 µl of tetraethylorthosilicate ("TEOS"), 100 µl of ethanol, 100 µl of propylamine and 25 µl of water were added to the solution, stirred and dried in a circular frame at room temperature to prepare CdSe/CdS.ZnS nanocrystal-silica composites.

Preparative Example 3

Preparation of QD-silica-PMMA Composites

The QD-silica composites were finely ground. About 0.1 g of the powder was placed in a vial, and then 0.5 ml of methyl methacrylate ("MMA"), 1 wt % AIBN and 1 ml of toluene were added thereto. The mixture was stirred at 60° C. for 24 hours. The reaction solution was centrifuged. The obtained precipitate was washed with chloroform (×3) and dried to prepare CdSe/CdS.ZnS nanocrystal-silica-polymethyl methacrylate ("PMMA") composites.

Example 1

Fabrication of LED 0.025 g of the nanocrystal-silica-PMMA composites prepared in Preparative Example 3 were homogeneously mixed with 0.5 ml of a solution of a polydimethylsiloxane resin (OE6630, Dow Corning, a mixture of OE6630A and OE6630B (1:4)), and air was completely removed therefrom under vacuum for 10 minutes to prepare a solution of the nanocrystal-silica-polymer-PDMS composites.

A circuit board having a recess was prepared. A silver ("Ag") frame and a light emitting diode chip emitting blue light of 445 nm were mounted on the bottom of the recess of the circuit board. 5 µl of a PDMS resin was applied within the recess of the circuit board to cover the Ag frame and the light emitting diode chip. Thereafter, the resulting structure was stored in an oven for about one hour while maintaining the temperature of the oven at 150° C. to cure the PDMS resin and was then cooled to room temperature. 15 µl of the composite solution was uniformly coated on the PDMS resin and stored in the oven for one hour while maintaining the temperature of the oven at 150° C. to cure the composites, completing the fabrication of anLED.

Comparative Example 1

A light-emitting diode was fabricated in the same manner as in Example 1 except that the nanocrystal-metal oxide composites prepared in Preparative Example 2 was used instead of the nanocrystal-silica-PMMA composites.

Test Example 1

Figure 3:
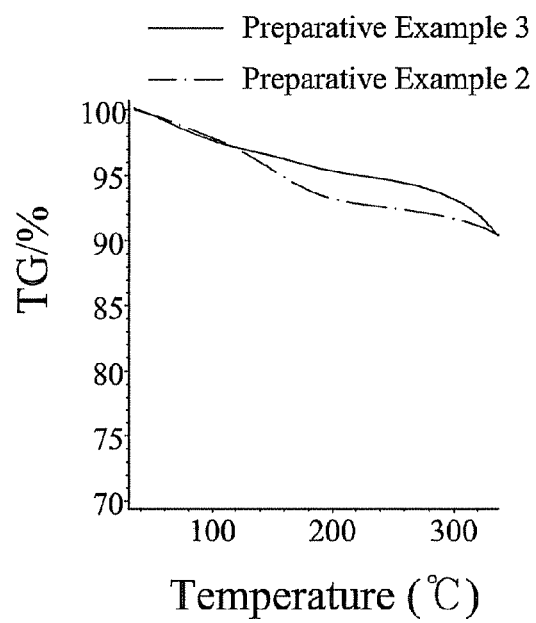
FIG. 3 is a graph showing the results of thermogravimetric analysis (TGA) for nanocrystal-metal oxide-polymer composites prepared in Preparative Examples 2 and 3.

Thermogravimetric analysis ("TGA") was performed on the nanocrystal-metal oxide composites prepared in Preparative Example 2 and the nanocrystal-metal oxide-polymer composites prepared in Preparative Example 3, and the results are shown in FIG. 3. The graphs of FIG. 3 reveal that the composites of Preparative Example 3 showed less reduction in the deterioration of thermal properties with increasing temperature than the composites of Preparative Example 2. The reason for this is believed to be that the nanocrystal-metal oxide composites were passivated by the polymer to allow the nanocrystal-metal oxide-polymer composites to have the thermal properties (e.g., stability below 400° C.) of the polymer.

Test Example 2

Figure 4:
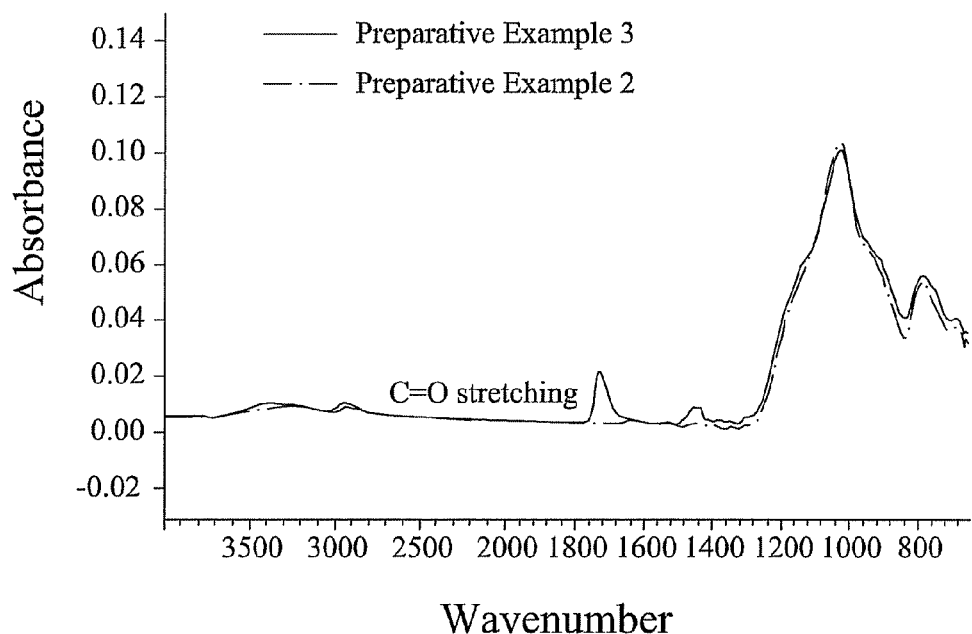
FIG. 4 is a graph showing the results of IR analysis for nanocrystal-metal oxide-polymer composites prepared in Preparative Examples 2 and 3.

IR analysis was performed on the nanocrystal-metal oxide composites prepared in Preparative Example 2 and the nanocrystal-metal oxide-polymer composites prepared in Preparative Example 3, and the results are shown in FIG. 4. A characteristic peak corresponding to C=O stretching of acrylate, was observed at around 1,700 cm$^{-1}$ in the IR spectrum of the composites of Preparative Example 3, which is indicative of the presence of the PMMA coating.

Test Example 3

Figure 5:
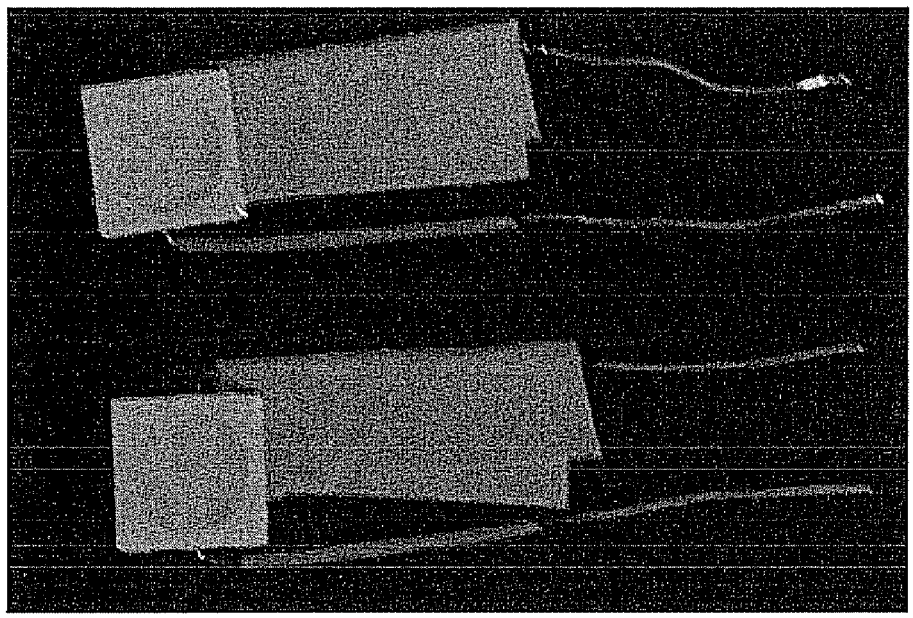
FIG. 5 shows photographs of a light-emitting diode fabricated in Example 1 before and after operation at 20 mA for 500 hours.
Figure 6:
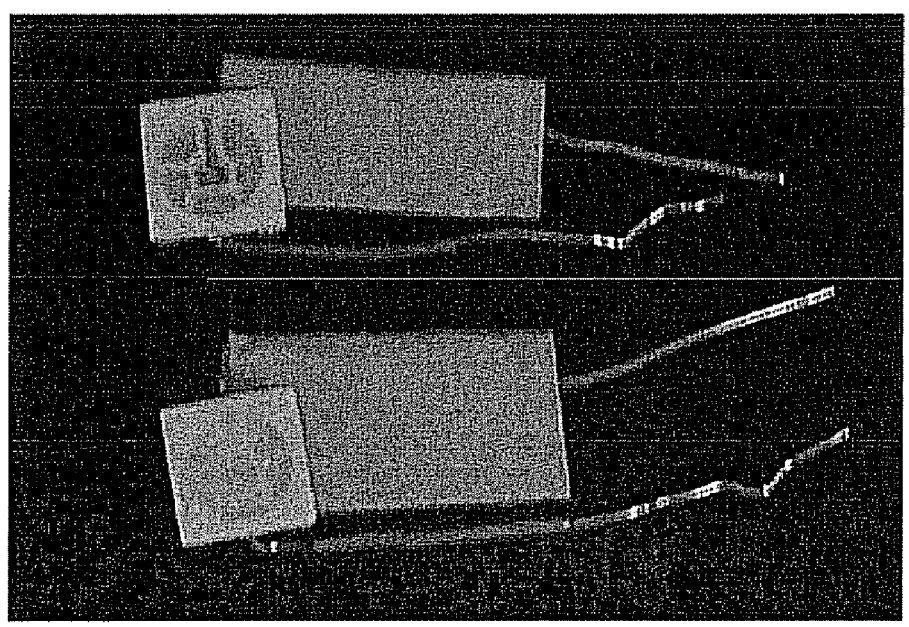
FIG. 6 shows photographs of a light-emitting diode fabricated in Comparative Example 1 before and after operation at 20 mA for 500 hours.

Photographs were taken before and after the light emitting diodes fabricated in Example 1 and Comparative Example 1 were operated at 20 mA for 500 hours, and are shown in FIGS. 5 and 6, respectively. The lower and upper photographs in FIGS. 5 and 6 represent the light emitting diodes before and after operation, respectively.

In the light emitting diode of Comparative Example 1, the Ag frame was deformed and the silica composites turned black in color due to the decomposition of the organic reactive groups present in the nanocrystal-metal oxide matrix (FIG. 6). In contrast, no serious color change was found in the light emitting diode of Example 1 even after operation (FIG. 5) which is indicative of no decomposition.

Test Example 4

Figure 7:
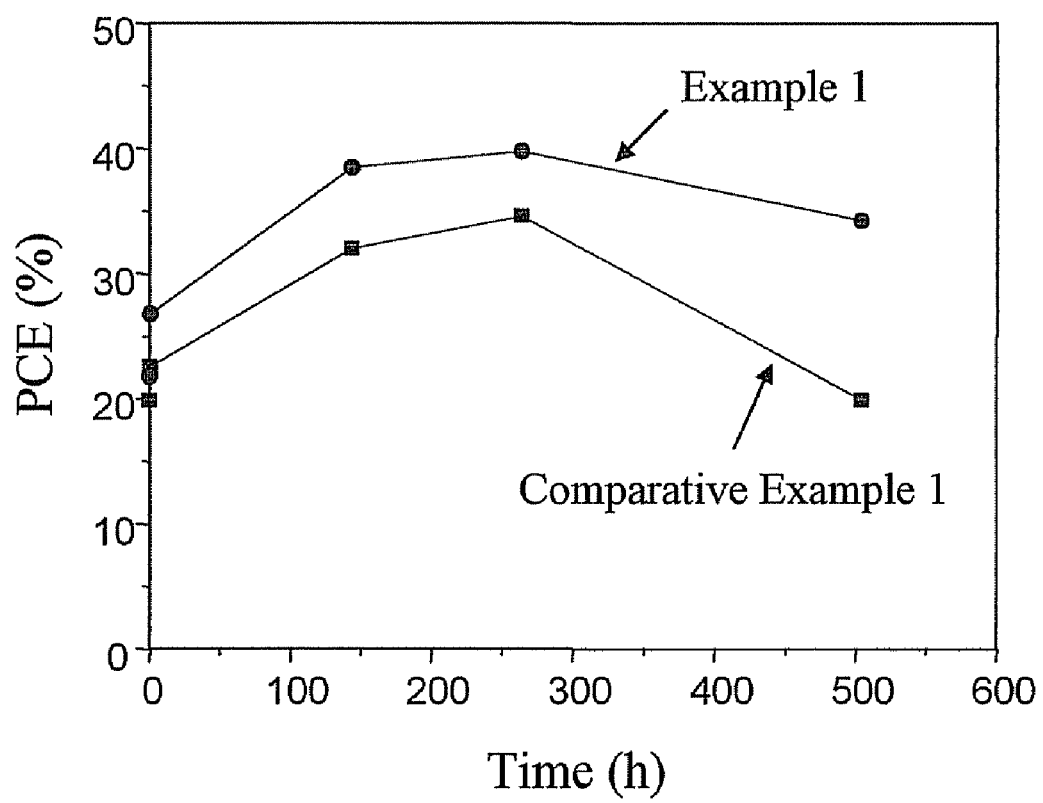
FIG. 7 is a graph showing the power conversion efficiency (PCE) of light-emitting diodes fabricated in Example 1 and Comparative Example 1.

The light emitting diodes fabricated in Example 1 and Comparative Example 1 were measured for power conversion efficiency ("PCE"), and the results are shown in FIG. 7. Referring to FIG. 7, the power conversion efficiency of the light emitting diode fabricated in Example 1 was maintained at a higher level than the initial efficiency even after operation for 500 hours or more, while the power conversion efficiency of the light emitting diode fabricated in Comparative Example 1 sharply decreased after operation. Such a decrease in the power conversion efficiency of the light emitting diode fabricated in Comparative Example 1 is attributed to the color change, which is indicative of decomposition, of the Ag frame of the light emitting diode.

The PCE was calculated by the following equation:

$$PCE(\%) = (\text{Area of emission spectrum of the nanocrystals in the red or green region})/(\text{Area of emission spectrum of blue } LED \text{ absorbed by the nanocrystals}) \times 100$$

Although exemplary embodiments have been disclosed in detail for illustrative purposes, those skilled in the art will appreciate that various modifications and changes are possible, without departing from the spirit and scope of the invention. Therefore, the scope of the invention should be defined by the claims that follow.

What is claimed is:

1. A method for preparing nanocrystal-metal oxide-polymer composites, the method comprising:
   reacting a surfactant with nanocrystals to modify the surfaces of the nanocrystals, the surfactant having at least one reactive group selected from the group consisting of —SR$_1$, —NR$_1$R$_2$, —OR$_1$, —COOR$_1$, —PR$_1$R$_2$, —P(=O)R$_1$R$_2$, —SiR$_1$R$_2$R$_3$ and —C(=O)R$_1$ (1) (wherein R$_1$ R$_2$ and R$_3$, which may be the same or different, is selected from the group consisting of H, C$_6$-C$_{24}$ alkyl, C$_6$-C$_{24}$ alkenyl, C$_6$-C$_{24}$ aryl and C$_6$-C$_{24}$ alkoxy);
   mixing the surface-modified nanocrystals, a metal oxide precursor, a dispersant, another surfactant, a solvent and water, and drying the mixture to obtain nanocrystal-metal oxide composites comprising the nanocrystals within a metal oxide matrix;
   preparing a monomer capable of covalently bonding to organic reactive groups of the nanocrystal-metal oxide composites; and
   polymerizing the nanocrystal-metal oxide composites and the monomer to prepare a polymer from the monomer and form covalent bonds between the polymer and the organic reactive groups of the metal oxide matrix.

2. The method of claim 1, wherein the surfactant for the surface modification of the nanocrystals is a bicompatible or multicompatible surfactant.

3. The method of claim 1, wherein the nanocrystals are those of at least one compound selected from the group consisting of metals, Group II-VI compounds, Group II-V compounds, Group III-VI compounds, Group III-V compounds, Group IV-VI compounds, Group I-III-VI compounds, Group II-IV-VI compounds, Group II-IV-V compounds and Group IV compounds; and alloys thereof.

4. The method of claim 1, wherein the nanocrystals have a core, a core-shell, a core-multishell, a core-intermediate layer-shell, a core-alloy layer-shell, a core-intermediate layer-multishell, or a core-alloy layer-multishell structure.

5. The method of claim 1, wherein the metal oxide precursor is selected from the group consisting of metal alkoxides, metal halides and metal hydroxides.

* * * * *